(12) United States Patent
Bhattacharjee et al.

(10) Patent No.: US 6,985,036 B2
(45) Date of Patent: Jan. 10, 2006

(54) DIGITALLY CONTROLLED TRANSCONDUCTANCE CELL

(75) Inventors: Jishnu Bhattacharjee, San Jose, CA (US); Debanjan Mukherjee, San Jose, CA (US); Abhijit Phanse, Sunnyvale, CA (US)

(73) Assignee: Scintera Networks, Inc., San Jose, CA (US)

( * ) Notice: Subject to any disclaimer, the term of this patent is extended or adjusted under 35 U.S.C. 154(b) by 79 days.

(21) Appl. No.: 10/724,449

(22) Filed: Nov. 26, 2003

(65) Prior Publication Data

US 2005/0110569 A1    May 26, 2005

(51) Int. Cl.
*H03F 3/45*     (2006.01)

(52) U.S. Cl. ....................................... 330/254; 330/253
(58) Field of Classification Search ................. 330/253, 330/254, 257
See application file for complete search history.

(56) References Cited

U.S. PATENT DOCUMENTS

| | | | | |
|---|---|---|---|---|
| 5,373,248 A | * | 12/1994 | Fernandez | 330/253 |
| 5,444,414 A | * | 8/1995 | Delano | 327/563 |
| 5,489,904 A | * | 2/1996 | Hadidi | 341/156 |
| 6,424,134 B2 | * | 7/2002 | Morishita et al. | 323/313 |
| 6,720,798 B2 | * | 4/2004 | Mulder et al. | 327/65 |

* cited by examiner

*Primary Examiner*—Patricia Nguyen
(74) *Attorney, Agent, or Firm*—MacPherson Kwok Chen & Heid LLP; Tom Chen (57) ABSTRACT

A digitally controlled transconductance cell includes a differential transistor pair coupled to load elements (either passive or active with resistive or impedance loads) and a variable bias current source, where the transconductance or gain is digitally varied by changing the aspect ratio of the transistors and the bias current.

28 Claims, 6 Drawing Sheets

DIGITALLY CONTROLLED TRANSCONDUCTANCE CELL

BACKGROUND

1. Field of the Invention

The present invention relates to electrical circuits, and in particular, to transconductance cells.

2. Related Art

As is known in the art, a transconductance cell is a basic electrical circuit or block used to build more complex electrical circuits, such as low noise amplifiers and analog filters. The transconductance cell performs the function of converting a voltage input into different current outputs, such as by varying the transconductance $g_m$ of the cell ($i_{out}=g_m*v_{in}$) The characteristics of a desirable transconductance cell include high bandwidth, low power consumption, high output impedance, low distortion, and good common mode rejection. Furthermore, with an ever-increasing need and use of high speed analog circuits and chips, transconductance cells should be able to provide these characteristics at high speeds with wide linear dynamic range and low power dissipation.

Figure 1A:
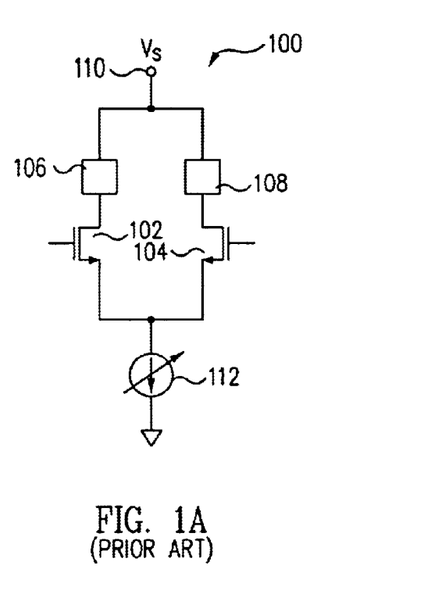
FIGS. 1A–1C show different types of conventional transconductance cells.

FIG. 1A shows a conventional transconductance cell 100, in which transconductance $g_m$ is varied by varying the current. Transconductance cell 100 includes two transistors 102 and 104, such as N-channel MOS transistors, resistive or impedance load elements 106 and 108 connected between the drain of transistors 102 and 104, respectively, and a voltage source 110, and a variable current source 112 connected between the source of both transistors 102 and 104 and ground. The transconductance is varied in such a cell by varying the amount of bias current generated by current source 112, such as with a control signal, of the differential transconductance pair. This, however, changes the linearity and increases power dissipation. Furthermore, to increase the gain (where gain is equal to $g_m*R_L$ (the load resistance)) by m, the drain current $I_D$ needs to be increased by a factor of $m^2$. The large increase in the drain current results in a large overhead in power dissipation. The voltage headroom ($V_{ds}$, viz. drain to source voltage of a MOS transistor) is also lowered and the variation in linearity is disadvantageously widened.

Figure 1B:
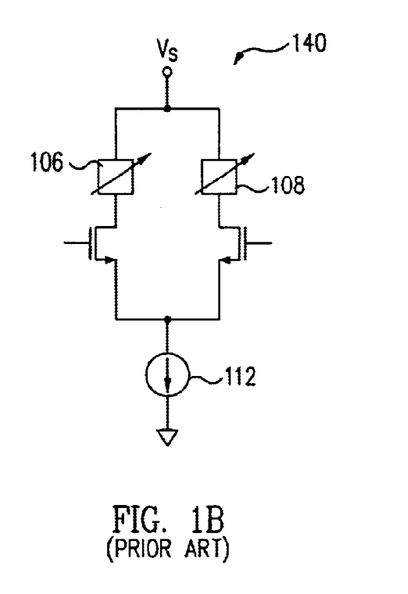

FIG. 1B shows another conventional transconductance cell 140, in which gain is changed by varying the load resistance. The structure of cell 140 is the same as cell 100 of FIG. 1A, except that load elements 106 and 108 are variable and current source 112 is constant. The load resistance of load elements 106 and 108 can be changed by varying characteristics of the components forming load elements 106. For example, load elements 106 may include an inductor and resistor in series (for a load impedance). The load impedance can then be changed by varying the resistance of the resistor and/or the inductance of the inductor. However, such a transconductance cell has limited gain controllability at higher speeds, e.g., in the multi-GHz range. Further, if the gain is to be increased, e.g., by a factor of m, the load resistance $R_L$ must be increased by m. This reduces the bandwidth BW of the device by m, since BW is proportional to $1/R_L$ (more specifically, $BW=1/(2\pi R_L C_L)$, where $C_L$ is the load capacitance).

Figure 1C:
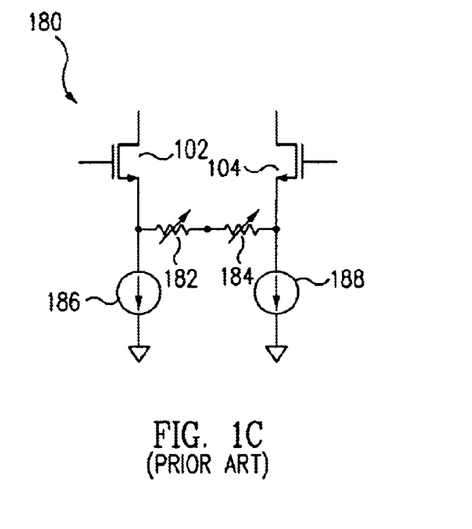

FIG. 1C shows a third kind of transconductance cell 180 that uses source degeneration to maintain a constant transconductance $g_m$ for the device. Cell 180 includes two transistors 102 and 104 coupled together at the respective sources by two resistors 182 and 184 in series. Current sources 186 and 188 are coupled to the respective sources of transistors 102 and 104. When the gate voltage is changed, the saturation current changes, with some of the current flowing through the resistors. This causes the source voltage to increase, which reduces the original increase in the saturation current caused by the increase in the gate voltage. The transconductance is reduced from its value with the source voltage held constant. Mathematically, the effective $g_m$ for this structure can be shown to be as follows:

$$g_{m_{eff}} = \frac{g_m}{1+g_m R_s}$$

where $R_s$ is the source degeneration resistance associated with resistors 182 and 184, which is varied to get variable transconductance. Hence, in this type of cell, the resistances associated with resistors 182 and 184 can be shown to be varying. However, such cells 180 can only be used at low speeds, since the effective lowering of the inherent $g_m$ reduces the transit frequency ($F_t$) of the device.

Accordingly, there is a need for a transconductance cell that provides variable transconductance at low power dissipation, while maintaining high bandwidth and linearity.

SUMMARY

According to one aspect of the present invention, both the aspect ratio of transistors and the current source are varied together to change the transconductance or gain of a transconductance cell. A constant ratio is maintained, where the ratio is the ratio of the current and the transistor size or aspect ratio [I/(W/L)]. This ratio determines the gate-to-source overdrive voltage of the device, i.e., $\Delta V=(V_{gs}-V_{th})$, which determines the linearity of the device. Accordingly, the ratio can be determined based on the linearity requirement so that the linearity is not affected (since the gate-source overdrive voltage for the transistors does not change). In one embodiment, the cell is formed with a differential transistor pair, wherein each drain is coupled to a resistive load and each source is coupled to a common variable bias current source. In one embodiment, the width of the device is changed to vary the aspect ratio. Changing the aspect ratio and bias current can be achieved by digitally switching on/off MOS device fingers both in the input differential pair as well as in the tail current source.

The transconductance cell can be utilized in a gain circuit with multiple transconductance stages. In different embodiments, each stage uses different combinations of variable bias current sources and differential input signals. In one embodiment, each stage uses the same variable bias current and same differential input signals, thereby allowing the circuit to provide high speed gain controllability while maintaining linearity. In another embodiment, each stage uses separate variable bias currents with the same differential input signals, which provides the circuit another degree of freedom in gain, bandwidth, and linearity control. In other embodiments, each stage uses different differential input signals, either with separate or same variable bias currents, which enables switching, summation, subtraction or multiplication at high speeds while maintaining bandwidth and linearity. Such circuits may also be used as linear interpolators, switchable delay cells, and continuous delay interpolators due to a linear relation between two different input signals.

In yet another embodiment, each transconductance stage uses the same input signals, but different outputs, taken at the drains of the differential transistor pair, allowing demultiplexing at higher speeds.

Digitally switched transconductance using cells of the present invention can also be applied to a multiplier circuit, where different differential input signals or voltages are can multiplied by different gains with high gain controllability and linearity at high speeds.

The transconductance cell of the present invention can achieve programmable transconductance, while maintaining high bandwidth, linearity, and voltage headroom at low power dissipation. It can be used to achieve many analog functionalities like constant and variable gain control, variable and constant $g_m$ control, multiplexing/demultiplexing, summation, subtraction, multiplication, linear combination and delay interpolation, all at high speeds (e.g., multi-GHz bandwidth) and low voltage supply with wide linear dynamic range.

This invention will be more fully understood in conjunction with the following detailed description taken together with the following drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

According to one aspect of the invention, a transconductance cell includes two variable sized transistors, a variable bias current source coupled to the sources of the two transistors, and two resistive load elements coupled to respective drains of the two transistors. The transconductance $g_m$ of the cell is varied by changing the size (or aspect ratio) of the transistors and the bias current. In one embodiment, the load elements may also be variable.

Figure 2:
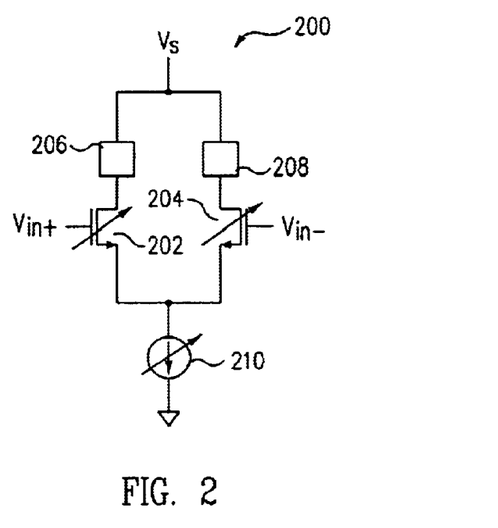
FIG. 2 shows a transconductance cell according to one embodiment of the present invention.

FIG. 2 shows a transconductance cell 200 according to one embodiment of the present invention.

Transconductance cell 200 is formed with two transistors 202 and 204, such as N-channel MOS transistors (as shown) or P-channel MOS transistors. The drain of transistors 202 and 204 are each coupled to one terminal of a load element 206 and 208, with the other terminal coupled to a voltage source $V_s$. Load elements 206 and 208 may be any suitable load having a resistance $R_L$ or impedance $Z_L$, as will be discussed below. The load may also be comprised of active elements, such as, but not limited to, diode-connected PMOS loads and active inductors. The source of each transistor 202 and 204 is coupled to a variable current source 210 that provides a bias current. The transconductance gm of cell 200 can be varied by changing size or aspect ratio (W/L) of the transistors, where W is the width of the transistor and L is the length, and the bias current (which changes the drain current $I_D$). High speed gain controllability can be achieved with cell 200, as will be discussed below.

Large channel length approximation has been assumed for the MOS transistors to simplify the analysis, but the concepts are also valid for deep submicron MOS transistors. In the saturation region of operation, the transconductance gm is given below in equation (1):

$$g_m = \sqrt{2I_D \beta \frac{W}{L}} \quad (1)$$

where $I_D$ is the drain current, W is the transistor width, L is the transistor length, and $\beta$ is equal to $\mu C_{ox}$, where $\mu$ is the mobility and $C_{ox}$ is the capacitance associated with the gate oxide of the transistor. Varying the transconductance $g_m$ varies the gain, since gain is equal to $g_m R_L$, where $R_L$ is the load resistance of load elements 206 and 208. Note that load resistance $R_L$ can also be an impedance $Z_L$, depending on the components forming load elements 206 and 208.

Thus, according to equation (1), the transconductance (or gain) can be varied by changing the drain current and the size (or aspect ratio W/L) of the transistors. In one embodiment, the width of the transistor is changed to vary the aspect ratio. The drain current is changed by varying the current of current source 210, such as with a control signal. Variable current sources and methods of varying the current are well known and not discussed in detail herein. In some embodiments, digital bits are used to control the bias current and the aspect ratio. Using digital bits to control the bias current (i.e., the reference current that is coming in to get mirrored into the tail current sources) can be with any known conventional method. Varying the transistor size and current, according to equation (1), allows a system designer a wide range of transconductance gains for the cell. For example, if both $I_D$ and W/L (or W) is increased by a factor of m, then the gain is increased by a factor of m.

In addition to a wide range of gain adjustments, transconductance cell 200 allows highly linear operations. This can be shown by the gate overdrive voltage $\Delta V$ of the transistor, given below in equation (2):

$$\Delta V = \sqrt{\frac{2I_D}{\beta \frac{W}{L}}} \quad (2)$$

$\Delta V$ determines linearity of the differential transconductance pair. Linearity is maintained if the gate overdrive voltage is kept constant. So, if the drain current and width (or aspect ratio) are both changed by a factor of m (which changes the gain by a factor of m), $\Delta V$ remains unchanged. As a result, linearity is maintained.

The present invention provides significant advantages over conventional transconductance cells. For example, assume gain is increased by a factor of m. In the transconductance cell of FIG. 1A, $I_D$ needs to be increased by a factor of $m^2$, which implies a huge overhead in power dissipation. The voltage headroom is also lowered ($IR_L$ drop), as discussed above. However, with cell 200 of the present invention, the current only needs to increase by a factor of m (along with an increase in aspect ratio of m). This results in a lower power dissipation and a higher voltage headroom (the $V_{ds}$ voltage of the MOS devices in the transconductance pair) than the cell of FIG. 1A. The gain variation of the transconductance cell of the present invention is also higher than that of the cell of FIG. 1A, since the cell of FIG. 1A uses only current variation to change $g_m$ (or gain). Consequently, $g_m$ (or gain) soon reaches a peak value and then decreases.

The present invention also provides a cell that has a higher bandwidth than conventional cells, such as cell 140 of FIG.

1B. The bandwidth BW of a cell (a first order system is assumed for simplicity) is given below in equation (3):

$$BW = \frac{1}{2\pi R_L C_L} \quad (3)$$

where $R_L$ is the load resistance and $C_L$ is the load capacitance of the load elements. Assuming a cascaded system where a standard cell is driving itself, $C_L=C_g+C_p$, where $C_g$ is the gate capacitance of the device and $C_p$ is the parasitic routing capacitance. In order to increase the transconductance or gain by a factor of m, $R_L$ needs to be increased by a factor of m for cell 140 of FIG. 1B, thereby reducing the bandwidth by the same factor, i.e., $BW=1/(2\pi R_L m(C_g+C_p))$. However, with cell 200 of the present invention, the reduction of bandwidth will be less, i.e., $BW=1/(2\pi R_L(mC_g+C_p))$. At higher speeds, when parasitics increase significantly, the increased difference in bandwidth will be even more pronounced. Moreover, unlike the present invention, resistor variation (whether achieved by digital switching or by active device tuning) has a substantial amount of parasitic cap, which further lowers the bandwidth.

The transconductance cell of the present invention can be used in many types of circuits to provide various benefits over circuits utilizing conventional cells. For example, the cell can be used to form a plurality of transconductance stages for use in a gain stage or stages of an AGC core. Each gain stage may receive control fine and coarse control signals to provide fine and coarse gain control within the particular gain stage.

Figure 3:
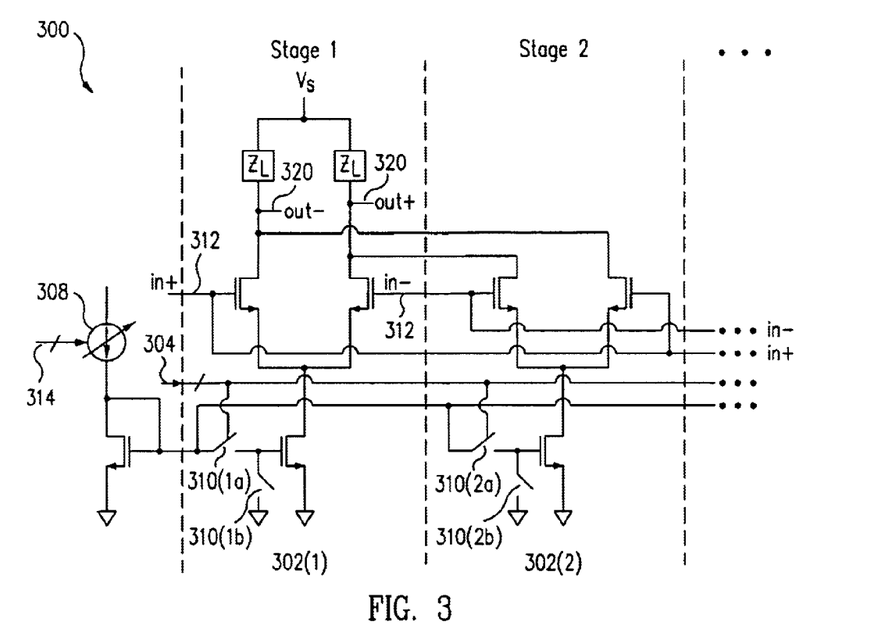
FIGS. 3–8 show different N-stage transconductance circuits according to various embodiments of the invention.

FIG. 3 shows an N-stage transconductance circuit 300 that uses the same bias currents and same input for each of the N stages according to one embodiment of the invention. Circuit 300 includes a number of digitally-switched transconductance ($g_m$) stages 302 (e.g., stages 302(1), 302 (2), ..., 302(N), where N corresponds to the number of desired stages and also the number of bits required from a control signal 304 for coarse gain control. Each stage 302 uses the same bias current from a variable current source 308 and the same differential input signals 312.

Each stage 302 includes a pair of complementary switches 310 (e.g., switches 310(1a) and 310(1b), 310(2a) and 310 (2b), through 310(Na) and 310(Nb) corresponding to stage 302(1), stage 302(2), through stage 302(N), respectively), which provide coarse control gain for circuit 300. Control signal 304, which includes N bits or bits, provides coarse gain control by controlling switches 310 within circuit 300. For example, if a first bit of control signal 304, corresponding to stage 302, is asserted, then switch 310(1a) is closed and switch 310(1b) is opened so that stage 302(1) provides its gain to an input signal 312. If the first bit of control signal 304 is deasserted, then switch 310(1a) is opened and switch 310(1b) is closed so that stage 302(1) does not provide its gain to input signal 312. Similarly, a second bit through to the last bit (N-bit) of control signal 304 controls corresponding switches 310(2a, 2b) to 310(Na, Nb) of corresponding stages 302(2) to 302(m) to provide the desired coarse gain for an output signal 320. Output signal 320 may represent the output signal for the AGC core or an input signal to the next gain stage.

A fine gain control signal 314 (fine gain control) controls variable current source 308 (e.g., a digitally-controlled current source) to control a bias current provided (e.g., mirrored) for each stage 302 to provide fine gain control to circuit 300. The combination of coarse and fine gain control, with a variable bias current and transistor sizes, enables precise gain control to maintain an approximately constant gain linearity across a wide dynamic range for input signal 312 at high speeds (e.g., multi-GHz).

Figure 4:
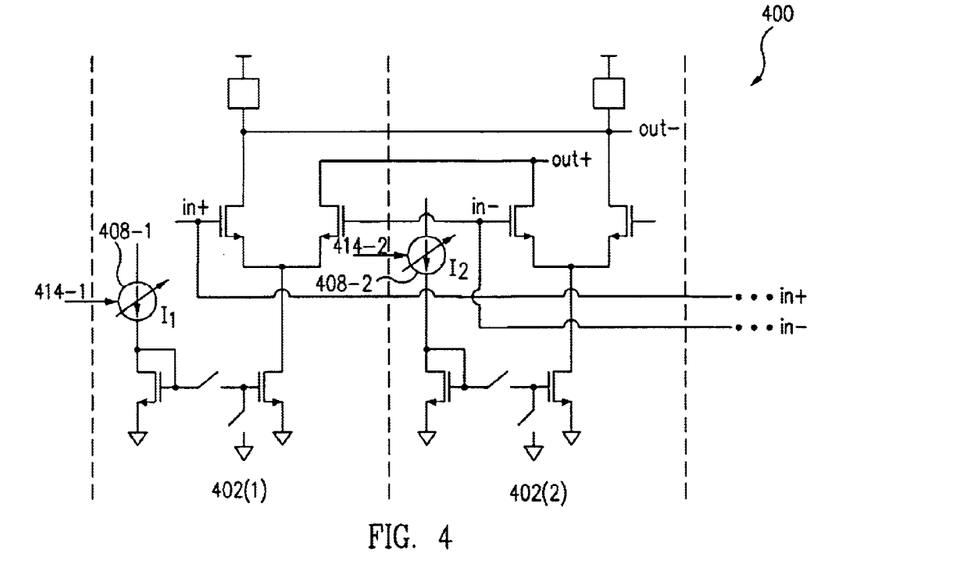

FIG. 4 shows an N-stage transconductance circuit 400 that uses the same input signals, but different bias current sources according to one embodiment. Each stage 402 of circuit 400 includes a variable current source 408-1 to 408-N, with each current source 408 controlled by a separate control signal 414-1 to 414-N, respectively. The differential input signal is the same for each stage. By using different bias currents, circuit 400 provides an additional degree of freedom for gain, bandwidth and linearity control.

Figure 5:
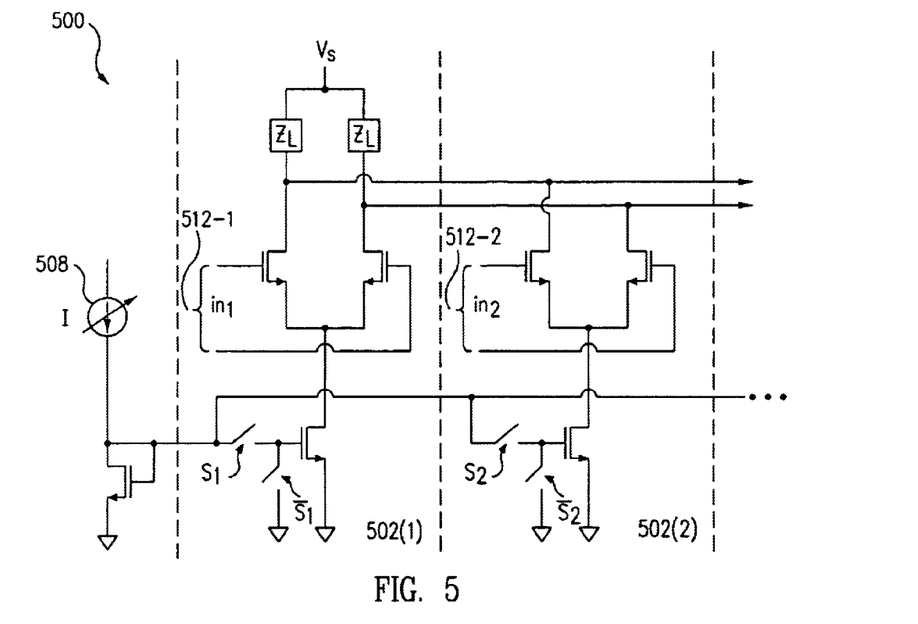
Figure 6:
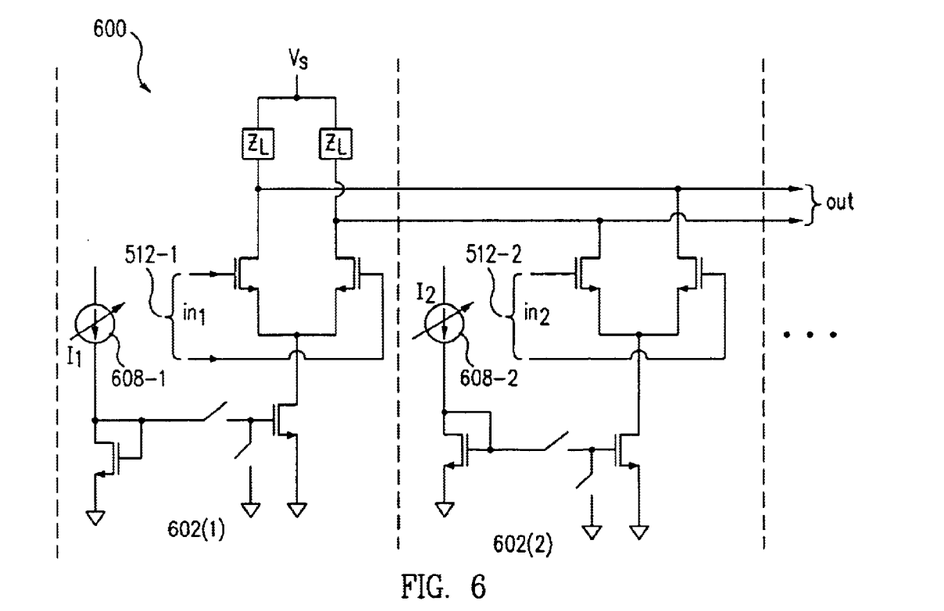

FIG. 5 shows an N-stage transconductance circuit 500 that uses the same variable bias current source, but different differential input signals according to another embodiment of the invention. The differential transistor pair of each stage 502 uses a separate input signal 512-1 to 512-N. A single variable bias current source 508 is digitally controlled to provide the same bias current to each stage 502. FIG. 6 shows an N-stage transconductance circuit 600 similar to circuit 500 of FIG. 5, except that each of N transconductance stages 602 uses a separate variable current source 608-1 to 608-N. Both circuits use different differential input signals in1, in2, ..., inN for each of the N transconductance stages.

With circuits 500 and 600, digitally switched transconductance can enable switching, summation, subtraction, or multiplexing, all at high speed maintaining bandwidth and linearity. Such circuits can also be used as linear interpolaters, since essentially, the differential output signal out=r1*in1+r2*in2, where r1 and r2 are the respective gains of two transconductance stages (e.g., the first and second stage),and in1 and in2 are the respective differential input signals of the two stages. For example, if one of the input signals is a delayed version of the other, e.g., in2(t)=in1(t−T), the circuit can be used as a switchable delay-cell and/or a continuous delay interpolator by varying the currents in addition.

Figure 7:
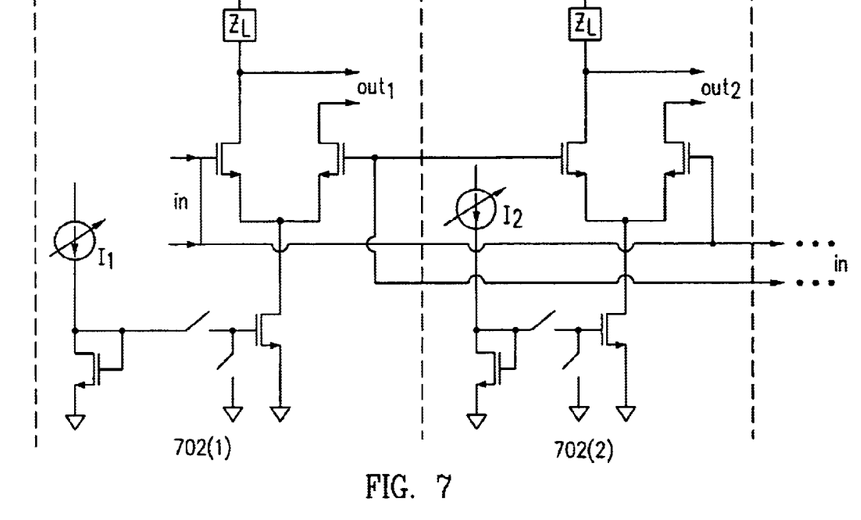

FIG. 7 shows an N-stage transconductance circuit 700 that uses the same input differential signal, but different outputs and variable bias current sources at each stage 702. Each output signal out1, out2, ..., outN is taken at the drain of each differential transistor pair. Circuit 700, with digitally switched transconductance, enables demultiplexing at much higher speed compared to conventional switching which lowers the bandwidth dramatically.

Figure 8:
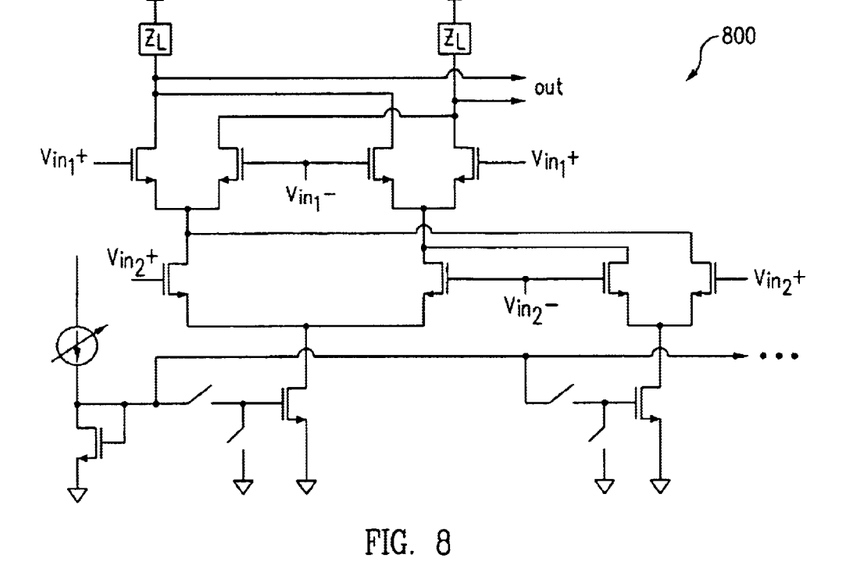

FIG. 8 shows another embodiment of an N-stage transconductance circuit 800, where the digitally switched transconductance described above is applied to a multiplier topology. In this example, the multiplier topology is a Gilbert cell multiplier, which uses the transconductance cell of the present invention for enabling gain controllability for the multiplier. Gilbert cell multipliers or mixers are known in the art, such as described in U.S. Pat. No. 5,847,623, entitled "Low noise Gilbert Multiplier Cells and quadrature modulators", which is incorporated by reference in its entirety. The variable bias current is the same for each stage. However, each stage has two separate input differential signals. Circuit 800 can be used to achieve gain controllability without sacrificing bandwidth and linearity in a high speed amplifier circuit.

In the above embodiments, the number of stages N depends, in part, on how much variability is required in the gain. For example, one implementation can be three stages with 1×, 2×, and 4× fingers (binary weighted), respectively, in both the differential pairs as well as the corresponding tail current sources. That way one can obtain 1× to 7× variation of gain without sacrificing linear dynamic range.

Other circuits in which the transconductance cell of the present invention can be used can be found in commonlyowned U.S. patent application Ser. No. 10/724,444, entitled "Method and Apparatus for Automatic Gain Control", filed Nov. 26, 2003, and U.S. patent application Ser. No. 10/724,561 entitled "Analog Signal Interpolation", filed Nov. 26, 2003, both of which are incorporated herein by reference in their entirety.

As discussed above, transconductance or gain is changed by varying the bias current and transistor size (e.g., width). However, as discussed above, the gain is equal to the transconductance $g_m$ multiplied by the load resistance or impedance. Therefore, the gain can also be changed by varying the load resistance or impedance for a particular circuit or application.

Figure 9A:
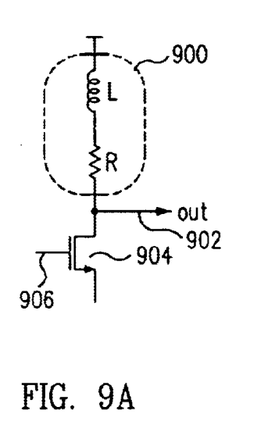
FIGS. 9A–9G show different load configurations for use in the transconductance cell and circuits of the invention.

FIGS. 9A–9G show different circuits for load elements 206 and 208 of FIG. 2 in accordance with an embodiment of the present invention. FIG. 9A shows a shunt (or shunt-peaked) load configuration 900 for load elements 206 and 208 having a resistor R in series with an inductor L. Also shown in FIG. 9A and the following FIGS. 9B through 9G are the coupling relationships of an output signal 902 relative to the exemplary implementations of load elements 206 and 208. FIGS. 9A–9G also show a transistor 904, such as an NMOS transistor, coupled to load element 900 via the drain of the transistor and an input signal 906 to the gate of transistor 904.

Figure 9B:
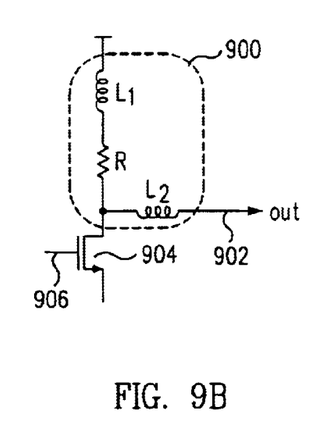
Figure 9C:
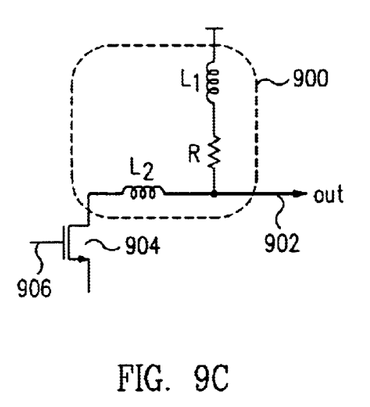
Figure 9D:
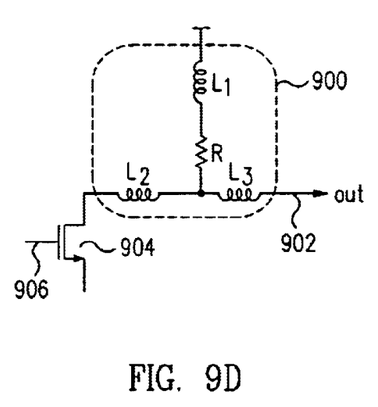
Figure 9E:
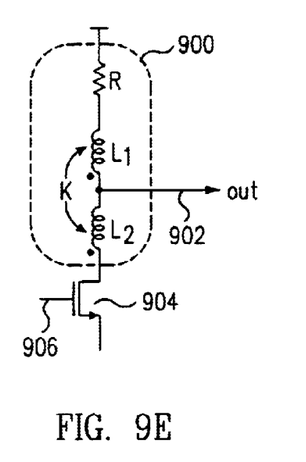
Figure 9F:
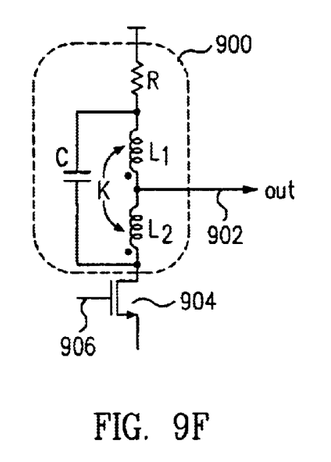
Figure 9G:
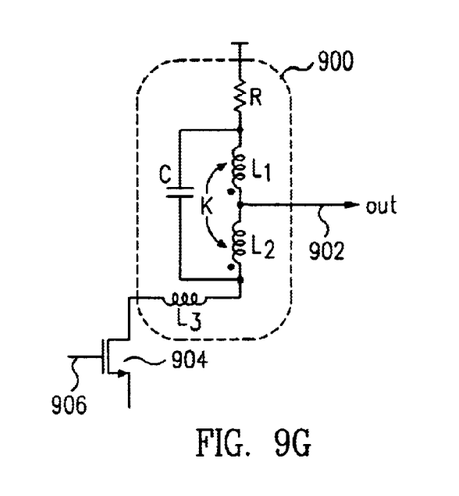

FIGS. 9B and 9C show a shunt-series and a series-shunt load configuration, respectively, for load element 900 having inductors $L_1$ and $L_2$ coupled to resistor R. FIG. 9D illustrates a series-shunt-series load configuration for load element 900 having inductors $L_1$, $L_2$, and $L_3$ coupled to resistor R as shown. FIGS. 9E and 9F illustrate a T-coil and a T-coil with cross-coupled capacitor C load configuration, respectively, for load element 900 having inductors $L_1$ and $L_2$ with associated magnetic coupling factor k. FIG. 9G illustrates a series-T-coil load configuration for load element 900 having resistor R, cross-coupled capacitor C, inductor $L_3$, and inductors $L_1$ and $L_2$ with associated magnetic coupling factor k.

In general, different types of broad-banding loads can be utilized for bandwidth extension per design requirements or desired application. The transconductance stages in combination with broad-band loads enables wide linear dynamic range with high bandwidth (e.g., multi-gigahertz). The transconductance circuits described herein also include load impedances, which may be optimized through appropriate broad-banding techniques to further enhance the bandwidth. Note, however, that the load impedances or resistances do not need to be varied or changed on-the-fly. Only the bias current and transistor size are changed for gain variation, although the load may be changed depending on the application, such as based on bandwidth requirements or limitations.

The above-described embodiments of the present invention are merely meant to be illustrative and not limiting. It will thus be obvious to those skilled in the art that various changes and modifications may be made without departing from this invention in its broader aspects. For example, the differential transistor pairs have been shown as NMOS transistors; however, PMOS transistors can also be used, with corresponding changes in the circuitry and control signals, as is known in the art. Therefore, the appended claims encompass all such changes and modifications as fall within the true spirit and scope of this invention.

What is claimed is:

1. A method of varying transconductance of a transconductance cell, wherein the cell comprises a first and a second load element, a first transistor coupled to the first load element, a second transistor coupled to the second load element, and a current source coupled to both the first and second transistors, the method comprising:
   varying the size of the first and second transistors; and
   varying a bias current from the current source.

2. The method of claim 1, wherein the size is the aspect ratio (W/L).

3. The method of claim 1, further comprising varying the impedance or resistance of the first and second load elements.

4. The method of claim 1, wherein varying the size and varying the bias current are performed together.

5. The method of claim 1, wherein varying the size and varying the bias current maintains a fixed ratio to maintain linearity.

6. The method of claim 5, wherein the fixed ratio is a gate overdrive voltage given by $$\sqrt{\frac{2I_D}{\beta\frac{W}{L}}},$$

where where $I_D$ is the drain current, W is the transistor widths, L is the transistor lengths, and $\beta$ is equal to $\mu C_{ox}$, where $\mu$ is the mobility, and $C_{ox}$ is the capacitance associated with the gate oxide of the transistors.

7. The method of claim 1, wherein the size and the bias current are varied digitally.

8. The method of claim 1, wherein the first and second transistors are MOS transistors.

9. A programmable transconductance cell, comprising:
   a voltage source;
   a differential transistor pair comprising a variable sized first transistor and a variable sized second transistor;
   a first load element coupled between the voltage source and the first transistor;
   a second load element coupled between the voltage source and the second transistor; and
   a variable current source coupled to the source of the first and second transistors.

10. The transconductance cell of claim 9, wherein the first and second transistors are MOS transistors.

11. The transconductance cell of claim 9, wherein the first and second load elements are passive load elements.

12. The transconductance cell of claim 9, wherein the first and second load elements are active load elements.

13. The transconductance cell of claim 9, where the variable current source is a digitally controlled variable current source.

14. The transconductance cell of claim 9, wherein the first and second transistors are digitally controlled variable sized transistors.

15. The transconductance cell of claim 9, wherein the first and second transistors are sized by adjusting the aspect ratio of the transistors.

16. An N-stage transconductance circuit, comprising:
   a voltage source;
   a first programmable transconductance cell coupled to the voltage source, the cell comprising:
      a first differential transistor pair comprising a variable sized first transistor and a variable sized second transistor, wherein the gate of the first and second transistor are configured to receive differential input signals;
      a first load element coupled between the voltage source and the first transistor;

a second load element coupled between the voltage source and the second transistor; and a first variable current source coupled to the source of the first and second transistors, wherein a first differential output signal of the circuit is received from the drain of the first and second transistors; and a control circuit for varying a current in the current source and the size of the first and second transistors.

17. The circuit of claim 16, wherein each stage uses the same first variable current source and same differential input signals.

18. The circuit of claim 16, further comprising a second variable current source, wherein a first stage uses the first variable current source and a second stage uses the second variable current source.

19. The circuit of claim 18, wherein each stage uses the same differential input signals.

20. The circuit of claim 16, wherein each stage uses different differential input signals.

21. The circuit of claim 20, wherein each stage uses the same first variable current source.

22. The circuit of claim 20, further comprising a second variable current source, wherein a first stage uses the first variable current source and a second stage uses the second variable current source.

23. The circuit of claim 16, further comprising a second differential transistor pair, wherein each stage uses the same differential input signals.

24. The circuit of claim 23, wherein a first stage output is the first differential output signal and a second stage output signal is received from the drains of the second differential transistor pair.

25. The circuit of claim 16, wherein N is the number of gain stages.

26. The circuit of claim 16, wherein fingers in the current source and differential pair for each of the N stages are binary weighted.

27. The circuit of claim 26, wherein N is at least two, with fingers in the first stage weighted by one and fingers in the second stage weighted by two.

28. The circuit of claim 26, wherein each stage k of the N stages is weighted by $2^k$, where k=0 to N−1.

* * * * *